United States Patent
Nasu et al.

(10) Patent No.: US 6,964,790 B1
(45) Date of Patent: Nov. 15, 2005

(54) METHOD FOR FORMING METALLIC TUNGSTEN FILM

(75) Inventors: Masayuki Nasu, Yamanashi-Ken (JP); Sakae Nakatsuka, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 277 days.

(21) Appl. No.: 10/030,919

(22) PCT Filed: Jul. 13, 2000

(86) PCT No.: PCT/JP00/04705

§ 371 (c)(1),
(2), (4) Date: Jan. 14, 2002

(87) PCT Pub. No.: WO01/06032

PCT Pub. Date: Jan. 25, 2001

(30) Foreign Application Priority Data

Jul. 14, 1999 (JP) ................... 11-200999

(51) Int. Cl.⁷ ............................................. C23C 16/08
(52) U.S. Cl. ...................................................... 427/253
(58) Field of Search ................................ 427/250, 252, 427/253

(56) References Cited

U.S. PATENT DOCUMENTS

| | | | |
|---|---|---|---|
| 5,306,666 A | * | 4/1994 | Izumi ........................ 438/680 |
| 5,407,698 A | * | 4/1995 | Emesh ....................... 438/199 |
| 5,433,975 A | * | 7/1995 | Roberts et al. ............. 427/253 |
| 5,480,489 A | | 1/1996 | Hasegawa |
| 5,795,824 A | * | 8/1998 | Hancock ..................... 438/656 |
| 6,156,382 A | * | 12/2000 | Rajagopalan et al. ....... 427/250 |

FOREIGN PATENT DOCUMENTS

| | | |
|---|---|---|
| JP | 3-223462 | 10/1991 |
| JP | 4-64223 | 2/1992 |
| JP | 4-74865 | 3/1992 |
| JP | 4-335526 | 11/1992 |
| JP | 6-163518 | 6/1994 |
| JP | 7-297151 | 11/1995 |
| JP | 8-264530 | 10/1996 |

* cited by examiner

*Primary Examiner*—Bret Chen

(74) *Attorney, Agent, or Firm*—Smith, Gambrell & Russell, LLP

(57) ABSTRACT

A deposition method for supplying process gases into an evacuated processing vessel to deposit a metal tungsten film on the surface of an object to be processed. The processing gases include tungsten hexafluoride gas, hydrogen gas, and a reducing gas which has a richer reducing property than that of the hydrogen gas, the amount of the reducing gas being smaller than that of the hydrogen gas. Thus, it is possible to form a metal tungsten film without increasing stress in the film so much even in a low temperature region of about 400° C. and without decreasing a deposition rate so much.

7 Claims, 4 Drawing Sheets

DEPOSITION RATE (Å/min)
| SiH4 (sccm) | WAFER SURFACE TEMPERATURE (°C) | | | PRESENCE OF PARTICLES |
|---|---|---|---|---|
| | 350 | 370 | 390 | |
| 0 | 1600 | 2300 | 2800 | NONE |
| 10 | 2000 | 2400 | 3000 | NONE |
| 20 | 2400 | 2700 | 3300 | NONE |
| 30 | 2200 | 2800 | 3300 | PRESENT |
| 40 | 2700 | 3300 | 3700 | PRESENT |
WF6 : 50 sccm, H2 : 2000 sccm
F I G. 2
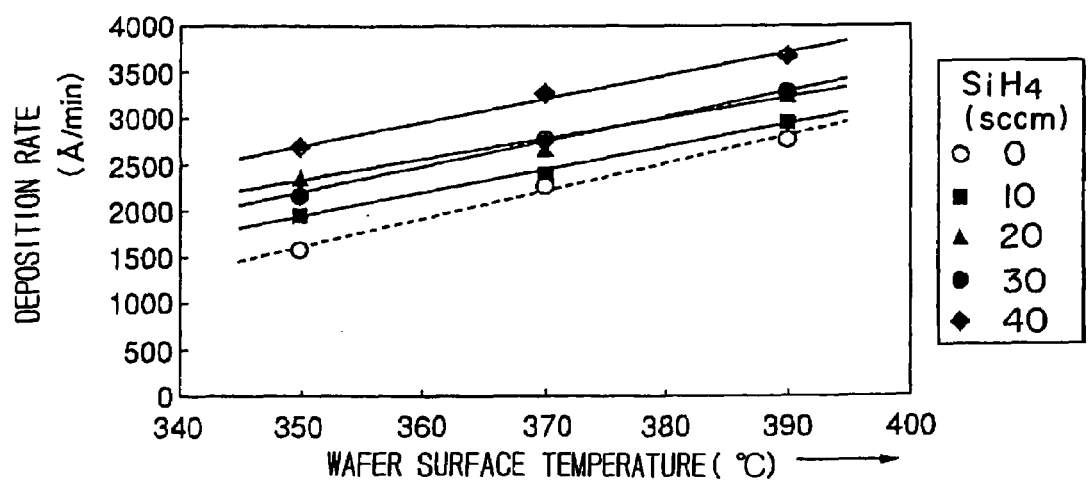
F I G. 3

STRESS IN FILM ($\times 10^{10}$dyne/cm$^2$)

| SiH$_4$ (sccm) | WAFER SURFACE TEMPERATURE (°C) | | |
|---|---|---|---|
| | 350 | 370 | 390 |
| 0 | 1.75 | 1.74 | 1.27 |
| 10 | 1.70 | 1.49 | 1.20 |
| 20 | 1.72 | 1.49 | 1.11 |
| 30 | 1.23 | 1.39 | 0.85 |
| 40 | 1.3 | 1.18 | 0.59 |

(FILM-THICKNESS 5500Å)   WF$_6$ : 50 sccm
                         H$_2$ : 2000 sccm

METHOD FOR FORMING METALLIC TUNGSTEN FILM

TECHNICAL FIELD

The present invention relates generally to a method for depositing a metal tungsten film on the surface of an object to be processed in an evacuated processing vessel by supplying process gases into the vessel.

BACKGROUND ART

In a typical process for fabricating a semiconductor integrated circuit, various processes, such as deposition, oxidation/diffusion and etching, on the surface of a semiconductor wafer serving as an object to be processed are repeatedly carried out.

During the process for fabricating the semiconductor integrated circuit, the formation of wiring films and the filling of irregularities, such as contact holes and through holes, tend to use a metal tungsten film which is difficult to be broken even if being scaled down, easy to be attached, and has a low specific resistance.

As a method for depositing such a metal tungsten film, there is generally known a method for using, e.g., a tungsten hexafluoride ($WF_6$) gas, as a tungsten metal containing raw material gas, to reduce it with $H_2$ gas, as a reducing gas, to deposit a tungsten film. In this case, the deposition temperature is generally set to be 440° C. on the surface of the wafer. The reasons for this are that, if deposition temperature is low, stress in the film increases to warp the semiconductor wafer itself and/or to peel away the film, and deposition rate decreases to extremely decrease throughput. In general, the temperature of a supporting table (susceptor) is higher than the temperature of the wafer by about 20° C.

In recent years, the allowable quantity of thermal diffusion and so forth decreases due to a tendency for a semiconductor integrated circuit to be further scaled down and multilayered, it is required to avoid exposing a semiconductor wafer to high temperatures during the fabrication of a circuit, so that it is desired that the deposition temperature of a tungsten film on the surface of the wafer is lower than 440° C., e.g. 420° C. or lower.

In the circumstances, as described in, e.g., Japanese Patent Laid-Open No. 4-74865, there is proposed a method for using $B_2H_2$ (diborane), $SiH_4$ (mono-silane), $PH_3$ (phosphine) or the like as a reducing gas in place of $H_2$, so as to deposit a tungsten film having good characteristics to some extent even in a low temperature region of about 300° C.

However, in the method disclosed in, e.g., Japanese Patent Laid-Open No. 4-74865, although it is certainly possible to deposit a metal tungsten film in a low temperature region, there are problems in that stress in the film is very large and the deposition rate remains to be not so high.

DISCLOSURE OF THE INVENTION

The present invention has been made in order to effectively solve the above described problems. It is an object of the present invention to provide a deposition method capable of forming a metal tungsten film without increasing stress in the film so much even in a low temperature region of about 400° C. and without decreasing a deposition rate so much.

The inventors have made the present invention by finding the fact that, if a reducing gas for reducing $WF_6$ gas, together with $H_2$ gas, is used on certain conditions, stress in a film can be decreased even if a low temperature region and a deposition rate can be maintained to be relatively high.

Basically, according to the present invention, there is provided a deposition method for depositing a metal tungsten film on a surface of an object to be processed in an evacuated processing vessel by supplying process gases into the vessel, wherein the processing gases include tungsten hexafluoride gas, hydrogen gas, and a reducing gas having a richer reducing property than that of the hydrogen gas, the amount of the reducing gas being smaller than that of the hydrogen gas.

Thus, it is possible to provide a deposition method capable of forming a film, which has relatively low stress in the film so much even in a low temperature region of, e.g., about 400° C., at a relatively high deposition rate.

For example, the processing temperature for processing the object may be in the range of from 280 to 420° C. on the surface of the object. This temperature range corresponds to the range of from about 300 to 440° C. as the set temperatures of, e.g., a supporting table.

For example, timing in starting to supply the reducing gas may be set to be slightly after timing in starting to supply the tungsten hexafluoride gas and hydrogen gas. Thus, when deposition starts, occurrence of a gas phase reaction of $WF_6$ gas causing production of particles can be inhibited, and the processing pressure for starting to cause a gas phase reaction can be shifted to a higher pressure.

Specifically, the timing in starting to supply the reducing gas is preferably set to be 3 to 6 seconds after the timings in starting to supply the tungsten hexafluoride gas and hydrogen gas.

For example, the reducing gas may be any one of $SiH_4$, $Si_2H_6$, $B_2H_6$, $SiH_2Cl_2$ and $PH_3$.

BRIEF DESCRIPTION OF THE DRAWINGS

FIG. 2 is a table showing processing conditions, deposition rates thereon, and the presence of particles;

FIG. 3 is a graph wherein the results shown in FIG. 2 are plotted;

BEST MODE FOR CARRYING OUT THE INVENTION

Referring to the accompanying drawings, the preferred embodiments of a deposition method and system according to the present invention will be described below in detail.

Figure 1:
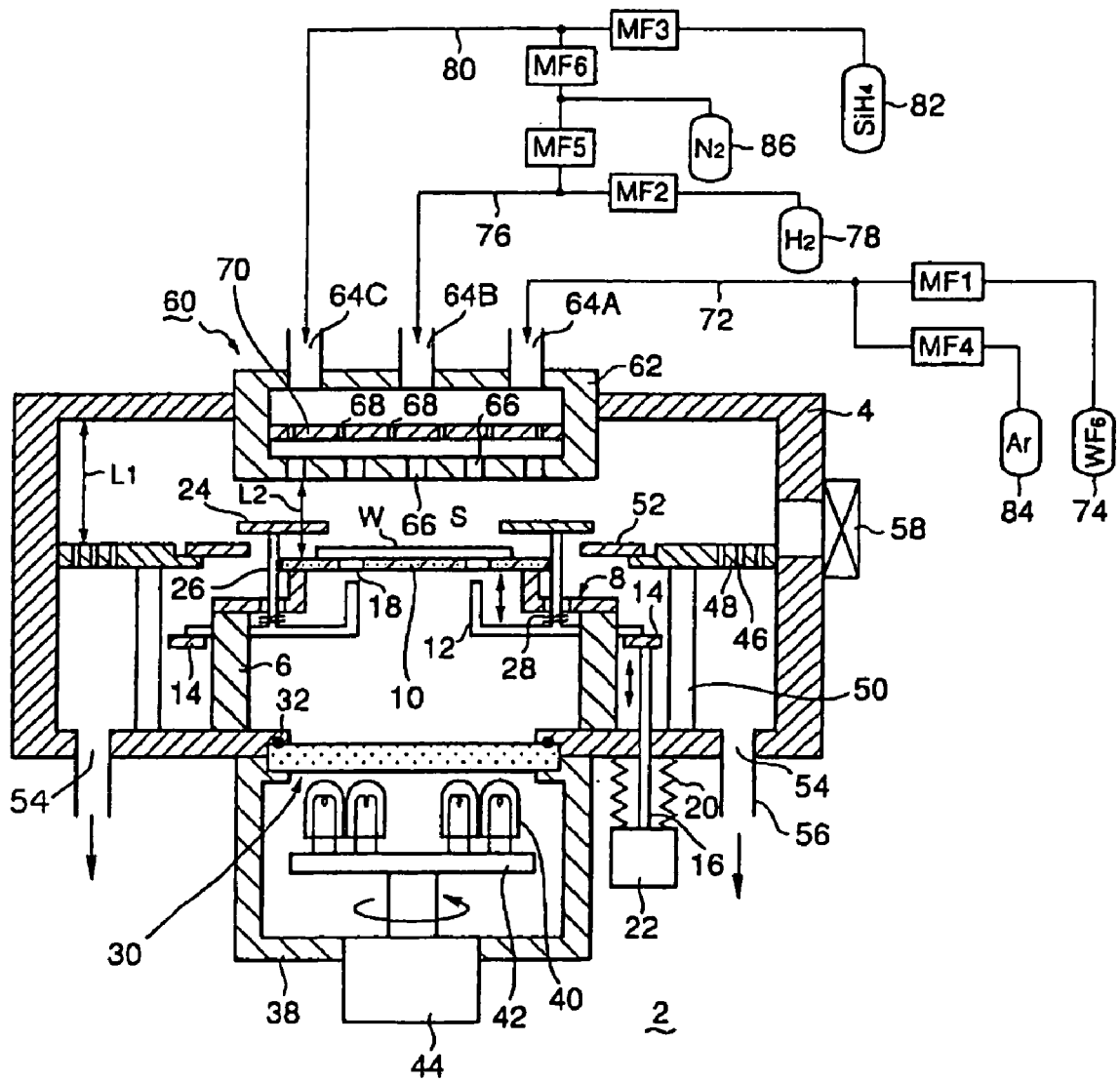
FIG. 1 is a sectional view showing an example of a deposition system for carrying out a deposition method according to the present invention.

FIG. 1 is a sectional view showing a deposition system according to the present invention. As an example of a deposition system, a single wafer depositing system for depositing a tungsten film using $WF_6$ as a deposition gas will be herein described. This deposition system 2 has a cylindrical or box-shaped processing vessel 4 of, e.g., aluminum.

In the processing vessel 4, a supporting table 10 is provided on a cylindrical reflector 6 which is raised from the bottom of the processing vessel.

The supporting table 10 functions as a holding means for mounting and holding thereon a semiconductor wafer W, which serves as an object to be processed, via a holding member 8 having, e.g., a L-shaped cross section. The reflector 6 is formed of, e.g., aluminum, in order to cause lamp light to reflect thereon. The holding member 8 is formed of a material having a low thermal conductivity, e.g., quartz, in order to intercept the supporting table 10 from heat conduction. The supporting table 10 is formed of, e.g., a carbon material or an aluminum compound, such as AlN, which have a thickness of about 1 mm.

Below the supporting table 10, a plurality of, e.g., three, lifter pins 12 are provided so as to extend upwards from a circular ring-shaped supporting member 14. By vertically moving the supporting member 14 by means of a push rod 16 passing through the bottom of the processing vessel, the lifter pins 12 are inserted into lifter pin holes 18 passing through the supporting table 10 to lift the wafer W.

The bottom end of the push rod 16 is connected to an actuator 22 via a flexible bellows 20 in order to maintain the airtight state in the processing vessel 4. In order to hold the peripheral edge portion of the wafer W, the peripheral edge portion of the supporting table is provided with, e.g., a substantially ring-shaped ceramic clamp ring 24 extending along the profile of the wafer. This clamp ring 24 is connected to the supporting member 14 via a supporting rod 26 passing through the holding member 8 with a play.

Around the supporting rod 26 between the holding member 8 and the supporting member 14, a coil spring 28 is provided. Thus, this assists the clamp ring 24 and so forth in their downward movement, and ensures to clamp the wafer. The lifter pins 12, the supporting member 14 and the holding member 8 are also formed of a heat ray transmittable member of quarts or the like.

In the bottom portion of the processing vessel directly below the supporting table 10, a transmission window 30 of a heat ray transmittable material, such as quarts, is airtightly provided via a sealing member 32, such as an O-ring. Below the transmission window 30, a box-shaped heating chamber 38 is provided so as to surround the transmission window 30. In the heating chamber 38, a plurality of heating lamps 40 serving as heating means are mounted on a rotatable table 42 also serving as a reflecting mirror. This rotatable table 42 is rotated by a rotating motor 44, which is provided on the bottom of the heating chamber 38, via a rotating shaft. Therefore, heat rays emitted from the heating lamps 40 transmit the transmission window 30 for the lamps to irradiate and heat the bottom surface of the supporting table 10.

On the side of the outer periphery of the supporting table 10, a ring-shaped straightening vane 48 having a large number of straightening holes 46 is supported on a cylindrical supporting column 50. On the side of the inner periphery of the straightening vane 48, a ring-shaped quarts attachment 52 is provided for contacting the outer peripheral portion of the clamp ring 24 to prevent gas from flowing below the clamp ring 24. In the bottom of the vessel 4 below the straightening vane 48, an outlet 54 is provided. The outlet 54 is connected to an exhaust passage 56 connected to a vacuum pump (not shown), so that the atmosphere in the processing vessel 4 can be maintained at a predetermined degree of vacuum. The side wall of the processing vessel 4 is provided with a gate valve 58 which is open and closed during the carrying-in/out of the wafer.

In the ceiling portion of the processing vessel facing the supporting table 10, there is provided a shower head 60 serving as a gas supply means for feeding the process gas or the like into the processing vessel 4. Specifically, the shower head 60 has a box-shaped head body 62 of, e.g., aluminum, and the ceiling portion thereof is provided with, e.g., three gas inlets 64A, 64B and 64C.

The bottom portion of the head body 62 is formed with a large number of gas nozzles 66 for releasing gas supplied into the head body 62 to a processing space S. These nozzles 66 are substantially arranged in the whole bottom surface of the head body 62 so as to release gas over the surface of the wafer. A diffusion plate 70 having a large number of gas diffusing holes 68 is provided in the head body 62 so as to more uniformly supply gas to the surface of the wafer.

As process gases required to deposit the metal tungsten film, three gases are used. The three gases include $WF_6$ gas serving as a tungsten-containing gas, $H_2$ gas, and a reducing gas, such as $SiH_4$, which has a richer reducing property than $H_2$ gas.

The first gas inlet 64A of the shower head 60 is connected to one end of a gas passage 72 in which a mass flow controller MF1 for controlling the flow rate of flowing gas is provided. The other end of the gas passage 72 is connected to a $WF_6$ gas source 74 for storing therein $WF_6$ gas. The second gas inlet 64B is connected to one end of a gas passage 76 in which a mass flow controller MF2 is provided. The other end of the gas passage 76 is connected to an $H_2$ gas source 78 for storing therein $H_2$ gas. The third inlet 64C is connected to one end of a gas passage 80 in which a mass flow controller MF3 is provided. The other end of the gas passage 80 is connected to an $SiH_4$ gas source 82 for storing therein $SiH_4$ gas.

In order to use, e.g., Ar gas, as a carrier gas for $WF_6$ gas, an Ar gas source 84 is connected to the middle of the gas passage 72 for $WF_6$ via a mass flow controller MF4. In order to use, e.g., $N_2$ gas, as carrier gases for $H_2$ gas and $SiH_4$, an $N_2$ gas source 86 is connected to the middle of the gas passage 76 for $H_2$ gas via a mass flow controller MF5, and the $N_2$ gas source 86 is connected to the middle of the gas passage 80 for $SiH_4$ via a mass flow controller MF6.

A deposition method using the deposition system with the above described construction will be described below.

First, the gate valve 58 provided on the side wall of the processing vessel 4 is open to carry the wafer in the processing vessel 4 by means of a transfer arm (not shown). Then, the lifter pins 12 are pushed up to deliver the wafer W to the lifter pins 12. Then, the push rod 16 is moved downwards to move the lifter pins 12 downwards, so that the wafer W is mounted on the supporting table 10. The push rod 16 is further moved downwards, so that the peripheral edge portion of the wafer W is pressingly fixed by the clamp ring 24.

Then, $WF_6$ (raw material gas), $H_2$ gas and $SiH_4$ gas (reducing gases), serving as process gases, from the process gas sources 74, 78 and 82, together with Ar and $N_2$ serving as carrier gases, are supplied to the shower head 60 to be mixed therein while the flow rates thereof are controlled. The mixed gas is substantially uniformly supplied from the gas nozzles 66 of the bottom of the head body 62 into the processing vessel 4. Simultaneously, the atmosphere in the processing vessel 4 is set as a predetermined degree of vacuum by sucking and exhausting gases in the processing vessel 4 via the outlet 54. The heating lamps 40 positioned below the supporting table 10 are also turned on while being rotated, so that heat energy is emitted.

The emitted heat rays transmit the transmission window 30 for the lamps to irradiate and heat the bottom surface of the supporting table 10. Since the supporting table 10 has a very small thickness of about 1 mm as described above, the supporting table 10 is rapidly heated, so that the wafer W mounted thereon can be rapidly heated to a predetermined temperature. The supplied mixed gas causes a predetermined chemical reaction to deposit and form, e.g., a tungsten film, on the surface of the wafer in accordance with deposition conditions.

The processing temperature of the processing conditions during deposition is set to be a lower temperature than a conventional processing temperature of, e.g., 440° C. on the surface of the wafer. For example, the processing temperature is set to be in the range of from 280° C. to 420° C. on the surface of the wafer. If the processing temperature is lower than 280° C. on the surface of the wafer, deposition itself is not caused. If the processing temperature is higher than 420° C. on the surface of the wafer, characteristics of the deposited film are not so preferred. The processing pressure is, e.g., about 80 Torr.

With respect to the flow rate of each of the process gasses, for example, the flow rate of $WF_6$ gas is about 50 sccm, the flow rate of $H_2$ gas is about 2000 sccm, and the flow rate of $SiH_4$ gas is about 20 sccm. The reason why the flow rate of $SiH_4$ gas having a richer reducing property than $H_2$ gas is far lower than the flow rate of $H_2$ gas is that a so-called blanket deposition for depositing a metal tungsten film on the whole surface of the wafer W is carried out.

With respect to the sizes of principal parts of the deposition system in this case, the size of the semiconductor wafer W is 8 inches (about 20 cm), the inside diameter of the processing vessel 4 is about 50 to 60 cm, the distance L1 between the ceiling portion of the processing vessel 4 and the supporting table 10 (the straightening vane 48) is about 8 cm, and the distance L2 between the bottom surface of the shower head 60 and the supporting table 10 is about 7 cm.

It is herein important that the above described three kinds of gases are not simultaneously fed into the processing vessel 4 to start deposition, so that timings in starting to supply the gases are different. Specifically, $WF_6$ gas and $H_2$ gas are first fed into the processing vessel 4, and the timing in starting to supply $SiH_4$ gas is at least about 3 seconds after the timing in starting to supply $WF_6$ gas and $H_2$ gas. The reason for this is that, if the above described three kinds of gases are simultaneously supplied into the processing vessel 4, a "gas phase reaction" for immediately reducing $WF_6$ gas in a gas phase with $SiH_4$ gas having strong reduction is caused, so that tungsten silicide particles as a kind of particles are suspended in the processing space S.

Since the processing temperature is relatively low in this case, the tungsten film is hardly deposited only by first supplying $WF_6$ gas and $H_2$ gas. If only $WF_6$ gas and $SiH_4$ gas are supplied without supplying $H_2$ gas, the above described gas phase reaction is caused to produce particles.

As described above, if a slightly smaller amount of $SiH_4$ gas having a richer reducing property than $H_2$ gas is added to $H_2$ gas to deposit a metal tungsten film, even if deposition is carried out in a low temperature region of from 280 to 420° C. on the surface of the wafer, the deposition rate can be maintained to be high to some extent, and stress in the deposited film can be maintained to be low.

Deposition rates and film stress were measured when metal tungsten films were deposited by the system shown in FIG. 1 while changing the flow rates of $WF_6$ gas and $SiH_4$. The results of evaluation thereof will be described below.

Figures 4, 5:
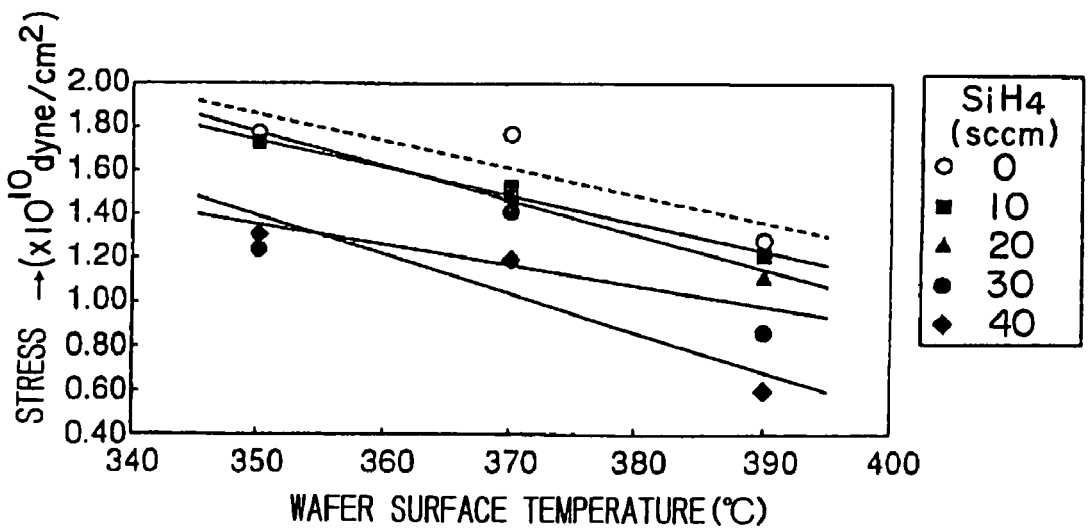
FIG. 4 is a table showing processing conditions and film stresses thereon.
FIG. 5 is a graph wherein the results shown in FIG. 4 are plotted.

FIG. 2 is a table showing processing conditions, deposition rates thereon, and the presence of particles, and FIG. 3 is a graph wherein the results shown in FIG. 2 are plotted. FIG. 4 is a table showing processing conditions and film stresses thereon, and FIG. 5 is a graph wherein the results shown in FIG. 4 are plotted.

The flow rates of $WF_6$ gas and $H_2$ gas were fixed to be 50 sccm and 2000 sccm, respectively, and the flow rate of $SiH_4$ gas was changed from 0 sccm to 40 sccm. The processing temperature on the surface of the wafer was changed from 350° C. to 390° C. The processing pressure was 80 Torr.

As can be clearly seen from FIGS. 2 and 3, it is revealed that the deposition rate is increasing as the flow rate of $SiH_4$ gas is increasing with respect to the flow rate of $WF_6$ gas and as the processing temperature is increasing. However, if the flow rate of $SiH_4$ gas exceeds 30 sccm, particles are produced so as not to be preferred. If the amount of $SiH_4$ gas to be added is too small, the deposition rate is also too low. Therefore, in view of the presence of particles and the deposition rate, it is revealed that the flow rate of $SiH_4$ gas is preferably about 10 sccm or more and less than about 30 sccm, and more preferably about 20 sccm, with respect to the flow rate of $WF_6$ of 50 sccm.

As can be clearly seen from FIGS. 4 and 5, it is revealed that stress in the film is decreasing as the processing temperature is increasing and as the amount of $SiH_4$ gas to be supplied is increasing. In particular, since stress in the film is about $1.4 \times 10^6$ dyne/cm$^2$ (thickness 5500 Å) in the conventional deposition method wherein the processing is about 440° C. on the surface of the wafer, it can be seen that stress equal to or less than that in the conventional method can be realized in the range of from 350 to 390° C., depending on the amount of $SiH_4$ gas to be supplied. Therefore, it is revealed that the conventional deposition temperature can be greatly decreased by adding a small amount of $SiH_4$ gas.

The timing in starting to supply $SiH_4$ gas after the timing in starting to supply $WF_6$ gas and $H_2$ gas was evaluated. The results of evaluation thereof will be described below.

Figures 6, 7:
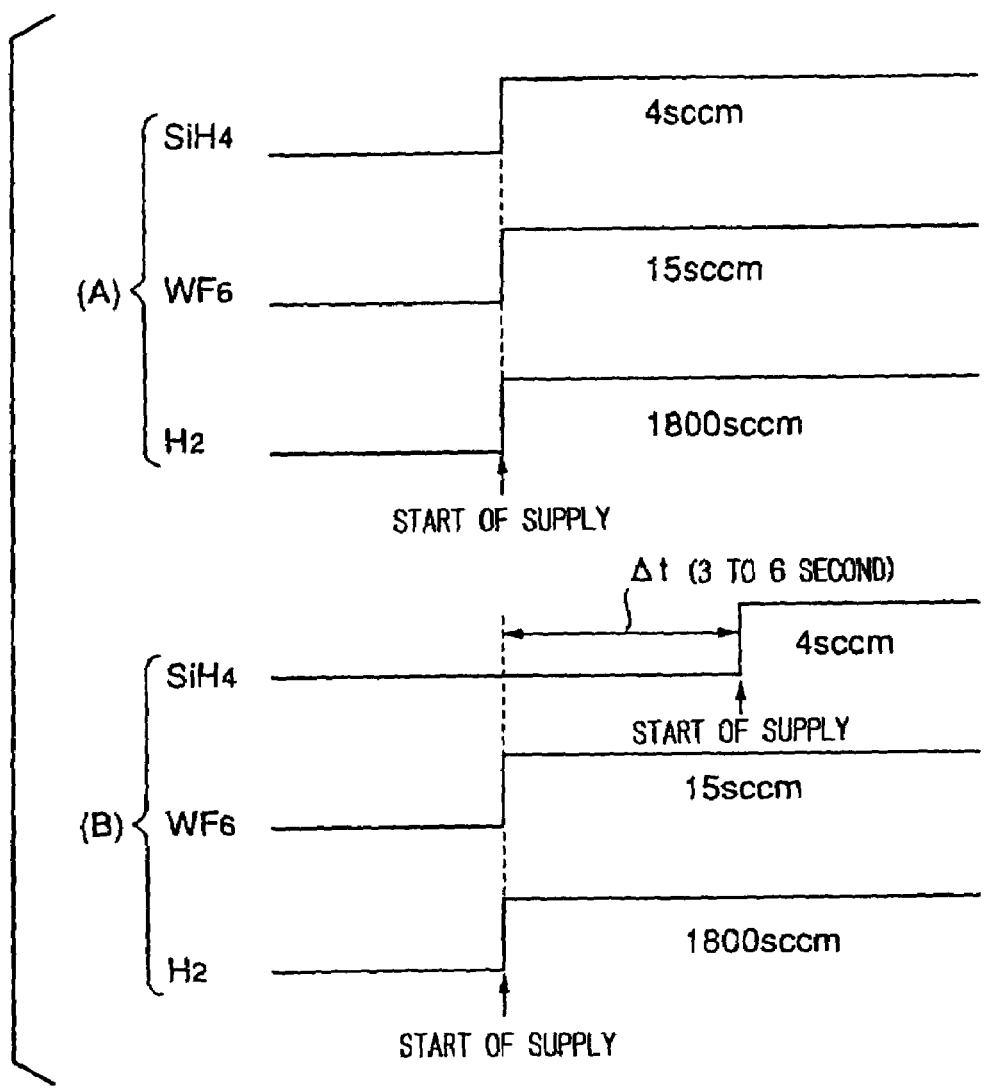
FIG. 6 is a chart showing timings in starting to supply process gases.
FIG. 7 is a table showing the relationship between processing pressures, occurrence of gas phase reactions, and the quantities of particles.

FIG. 6 is a chart showing the timings in starting to supply the respective gases, and FIG. 7 is a table showing the relationship between processing pressures, occurrence of gas phase reactions, and the quantities of particles (the numbers of counted particles of 0.2 μm or more). The gas phase reaction can be visually verified by the production of black smoke from the outside of the processing vessel.

FIG. 6(A) shows a case of no delay, i.e., a case where three kinds of gases are simultaneously supplied, and FIG. 6(B) shows a delayed case, i.e., a case where timing in starting to supply $SiH_4$ gas is delayed by Δt seconds. In this case, Δt was set in the range of from 3 to 6 seconds. The amount of $SiH_4$ gas to be supplied was 4 sccm, the amount of $WF_6$ gas to be supplied was 15 sccm, the amount of $H_2$ gas to be supplied was 1800 sccm, and the processing temperature was 390° C. on the surface of the wafer.

As shown in FIG. 7, in the case of no delay (FIG. 6(A)), particles are produced even if the processing pressure is 4 Torr, and a gas phase reaction starts to be caused when the processing pressure is 30 Torr. On the other hand, in the delayed case (FIG. 6(B)), particles (seventeen particles) are first produced when the processing pressure is 40 Torr, and a gas phase reaction starts to be caused when the processing pressure is 60 Torr. This indicates that the delay of timing in starting to supply $SiH_4$ gas can preferably inhibit the production of particles and increase the processing pressure, i.e., increase the deposition rate. When the delay time Δt was shorter than 3 seconds, the results of evaluation were substantially the same as those in the case of no delay.

While $SiH_4$ gas have been used as a reducing gas having a richer reducing property than $H_2$ gas in the above described preferred embodiment, $Si_2H_6$ gas, $B_2H_6$ gas, $SiH_2Cl_2$ gas, $PH_3$ gas or the like may be used.

While the deposition system coping with 8-inch (about 20 cm) wafers has been described as an example, the present invention may be applied to a deposition system coping with, e.g., 6-inch (about 15 cm) or 12-inch (about 30 cm) ware. In that case, of course, the flow ratios of the respective gases are the same as those in the above described preferred embodiment although the flow rates of the gases vary.

While the system has used the heating lamps as heating means, the present invention should not be limited thereto, but the invention may be applied to a system using a resistance heater wherein a supporting table includes a heater.

The type of the deposition system should not be limited to the single wafer depositing system for processing semiconductor wafers one by one. For example, the present invention may be applied to a so-called batch depositing system for simultaneously depositing films on about twenty-five wafers, which are supported on a wafer boat serving as a holding means at regular intervals, in a vertical processing vessel of, e.g., quarts.

The object to be processed should not be limited to the semiconductor wafers, but the object may be an LCD substrate or a glass substrate.

What is claimed is:

1. A method for depositing a metal tungsten film on a surface of an object to be processed in an evacuated processing vessel by supplying process gases into said vessel;

wherein said processing gases include tungsten hexafluoride gas, hydrogen gas, and a reducing gas having a greater reducing property than that of said hydrogen gas, the amount of said reducing gas being smaller than that of said hydrogen gas; and wherein timing in starting to supply said reducing gas is set to be at least about three seconds after timing in starting to supply said tungsten hexafluoride gas and hydrogen gas.

2. The method as set forth in claim 1, wherein a processing temperature for processing said object is in the range of from 280 to 420° C. on the surface of said object.

3. The method as set forth in claim 2, wherein the timing in starting to supply said reducing gas is set to be 3 to 6 seconds after the timing in starting to supply said tungsten hexafluoride gas and hydrogen gas.

4. The method as set forth in claim 2, wherein said reducing gas is any one of $SiH_4$, $Si_2H_6$, $B_2H_6$, $SiH_2Cl_2$ and $PH_3$.

5. The method as set forth in claim 1, wherein the timing in starting to supply said reducing gas is set to be 3 to 6 seconds after the timing in starting to supply said tungsten hexafluoride gas and hydrogen gas.

6. The method as set forth in claim 1, wherein said reducing gas is any one of $SiH_4$, $Si_2H_6$, $B_2H_6$, $SiH_2Cl_2$ and $PH_3$.

7. A method for depositing a metal tungsten film on a surface of an object to be processed in an evacuated processing vessel by supplying process gases into said vessel;

wherein said processing gases include tungsten hexafluoride gas, hydrogen gas, and a reducing gas provided in an amount smaller than that of said hydrogen gas; and wherein timing in starting to supply said reducing gas is set to be at least about three seconds after timing in starting to supply said tungsten hexafluoride gas and said hydrogen gas.

* * * * *